United States Patent [19]
Chivukula et al.

[11] Patent Number: 5,612,560
[45] Date of Patent: Mar. 18, 1997

[54] ELECTRODE STRUCTURE FOR FERROELECTRIC CAPACITORS FOR INTEGRATED CIRCUITS

[75] Inventors: Vasanta Chivukula, Nepean; Pak K. Leung, Kanata, both of Canada

[73] Assignee: Northern Telecom Limited, Montreal, Canada

[21] Appl. No.: 551,264

[22] Filed: Oct. 31, 1995

[51] Int. Cl.$^6$ ................................................. H01L 27/108
[52] U.S. Cl. .................... 257/309; 257/310; 257/534; 361/305
[58] Field of Search ........................... 257/295, 301–311, 257/532, 534, 763, 764, 766; 361/303, 305, 313, 321; 365/145, 149

[56] References Cited

U.S. PATENT DOCUMENTS

| | | | |
|---|---|---|---|
| 5,005,102 | 4/1991 | Larson | 257/295 |
| 5,393,352 | 2/1995 | Summerfelt | 148/33.3 |

*Primary Examiner*—Sara W. Crane
*Assistant Examiner*—Minhloan Tran
*Attorney, Agent, or Firm*—Angela C. de Wilton

[57] ABSTRACT

An improved electrode structure compatible with ferroelectric capacitor dielectrics is provided. In particular, a multilayer electrode having improved adhesion to ferroelectric materials such as PZT is formed comprising a first layer of a noble metal, a second layer of another metal and a thicker layer of the noble metal, which are annealed to cause controlled interdiffusion of the layers forming a mixed metal surface layer having a rough interface with the dielectric layer. For example, the first two layers comprise relatively thin ~200Å layers of Pt and Ti, and then a thicker layer of the main, first, electrode material is deposited on top. Non-uniform interdiffusion of the layers during annealing causes intermixing of the Pt and Ti layers at the interfaces forming a Pt/Ti alloy having a rough surface. The rough surface, and particularly hillocks formed at the interface, penetrate into the ferroelectric films, and anchor the electrode material to the dielectric. Improved adhesion of the conductive electrode material improves integrity of this interface during subsequent processing.

8 Claims, 2 Drawing Sheets

ELECTRODE STRUCTURE FOR FERROELECTRIC CAPACITORS FOR INTEGRATED CIRCUITS

FIELD OF INVENTION

This invention relates to an electrode structure for ferroelectric capacitors for integrated circuits, and a method of formation thereof.

BACKGROUND OF INVENTION

Ferroelectric thin film dielectrics have applications in integrated circuits, for example, as ferroelectric capacitor elements as used in ferroelectric DRAMs. Ferroelectric dielectric materials for integrated circuit applications are typically complex metal oxides of the perovskite structure, of which barium strontium titanate and lead zirconate titanate are well known examples. The materials may be used undoped, or doped, e.g. lead lanthanum zirconate titanate (PLZT). The functional properties of these ferroelectric materials are typically dependent on the nature of the substrate on which they are formed, that is, the material forming conductive electrodes of the capacitor element. In particular, the electrode material selected must resist oxidation under the processing conditions used for formation of the ferroelectric material. Processes for formation of ferroelectric dielectrics may involve processing/annealing in oxidizing ambients, e.g. oxygen and ozone. Thus, conventional electrode materials including polysilicon, aluminum, titanium are unsuitable because they tend to oxidize and/or react with ferroelectrics, such as PZT, under these conditions. Noble metals, particularly platinum, have thus been the most successful bottom electrode material, although the use of gold is often restricted in silicon IC processing.

The adhesion of ferroelectric films such as PZT to platinum is reasonably good when the Pt forms a bottom electrode of a capacitor. That is, when a ferroelectric precursor is deposited on a Pt electrode, the Pt layer provides the initial support as the nucleation centre for crystallization of a ferroelectric phase of the material, and adhesion is satisfactory. However, after crystallization of the ferroelectric layer, adhesion of a top electrode of platinum formed on the processed PZT is poor. The sequence of processing means that the interface between the bottom electrode and the PZT and between the PZT and the top electrode are quite different, and thus the capacitor structure is not symmetric.

Often, the Pt layer forming the top electrode tends to lift during processing, and electrical characteristics are poor or unreproducible. While some other metals, e.g. Al and Ti, adhere better to PZT, they tend to oxidize at the interface, degrading electrical characteristics.

SUMMARY OF THE INVENTION

The present invention seeks to provide an improved conductive electrode structure, compatible with ferroelectric dielectrics for capacitor elements for integrated circuits, and a method of formation thereof, which reduce or avoid the above-mentioned problems.

According to one aspect of the present invention there is provided an integrated circuit comprising a ferroelectric capacitor having first and second conductive electrodes and a ferroelectric capacitor dielectric disposed therebetween, at least one electrode comprising a first thin layer of a noble metal adjacent the ferroelectric dielectric, an intermediate layer of an other metal, and a second thicker layer of a noble metal, wherein non-uniform interdiffusion of the noble metal and other metal layers at the interface with the ferroelectric layer to form a mixed metal layer having a rough surface penetrating the ferroelectric layer, thereby anchoring the electrode material in the ferroelectric dielectric.

The rough interface between the electrode and the dielectric is caused by non-uniform interdiffusion of the noble metal and other metal near the interface, forming a mixed metal layer having a rough surface, which improves adhesion between the layers. For example, where the noble metal is platinum and the other metal is titanium, the resulting mixed layer comprises a Ti/Pt alloy layer. The surface of the resulting alloy layer is characterized by a rough surface, comprising "hillocks" or discrete bumps in the surface, which penetrate the dielectric layer at the interface and anchors the electrode material to improve adhesion of the electrode materials to the ferroelectric layer. This multilayer interdiffused electrode structure is a particularly advantageous structure when an electrode is formed on an already formed layer of ferroelectric dielectric.

Preferred noble metals include platinum and palladium and the other metal preferably comprises titanium or chromium.

The multilayer layer electrode structure is found to exhibit good adhesion to ferroelectric dielectrics, including e.g. lead zirconate titanate and lead lanthanum lead zirconate, whether the electrode is formed before or after the adjacent ferroelectric layer. If required a barrier layer may be disposed between the ferroelectric material and the electrode.

According to another aspect of the present invention there is provided a method of forming an electrode structure for a ferroelectric capacitor having first and second conductive electrodes and a layer of ferroelectric dielectric disposed therebetween, the method comprising providing a multilayer conductive electrode structure on the ferroelectric dielectric layer by steps comprising: providing a first, thin layer of a noble metal, forming thereon a thin layer of another metal comprising one of titanium and chromium, and then providing another thicker layer of a noble thereon, and annealing at a temperature sufficient to cause interdiffusion of the noble metal and other metal, thereby forming a mixed metal layer having a rough surface at the interface of electrode and the ferroelectric material for anchoring the electrode to the ferroelectric dielectric.

Preferably the first thin layer of noble metal comprises a layer of approximately 200Å platinum, deposited directly on the ferroelectric dielectric layer; a thin layer Ti is of about the same thickness, i.e. approximately 200Å of Ti is then deposited on the platinum; and then a second, thicker layer of Pt, e.g. 1000Å Pt formed thereon, providing the main portion of the electrode.

Annealing is carried out at a suitable temperature, compatible with maintaining the integrity of other device structures on the substrate. For example a suitable anneal was done at 400° C. to 450° C. During annealing intermixing of the Pt and Ti layers takes place at the interfaces forming a Pt/Ti alloy. However, since the reaction and mixing does not take place uniformly throughout the thickness, and formation of hillocks takes place at the interface. These hillocks of conductive material, comprising a Pt/Ti alloy, penetrate into the ferroelectric films and act as anchors. The ferroelectric layer therefore provides the required support for the overlying electrode layers more effectively.

Beneficially, the first and second electrodes of the capacitor are each formed by a multilayer Pt/Ti/Pt.

The triple layer Pt/Ti/Pt electrode structure is wet etchable in aqua regia, which is conventionally used for Pt etching.

Palladium or platinum are preferred metal over gold for the noble metal layers. Chromium and titanium are preferred metals for the other metal layer, which forms the mixed layer or alloy with the noble metal layers.

Thus improved adhesion of the overlying conductive films is observed, which improves integrity of this interface during subsequent processing.

BRIEF DESCRIPTION THE DRAWINGS

DESCRIPTION OF THE PREFERRED EMBODIMENTS

Figure 1:
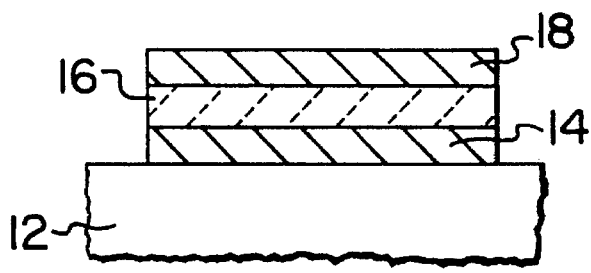
FIG. 1 shows a schematic cross-sectional view through part of an integrated circuit comprising a known prior art ferroelectric capacitor structure.

A schematic cross-sectional diagram through a part of a conventional ferroelectric dielectric capacitor structure 10 is shown in FIG. 1, and comprises a first, (bottom) electrode 14 formed on an integrated circuit substrate 12, a ferroelectric dielectric layer 16 and a second (top) electrode 18. The first and second electrodes typically comprise a noble metal e.g. Pt. The electrode may comprises one or more layers of conductive materials. When using electrode materials that may oxidize or react with the ferroelectric material, a suitable barrier layer may be placed between the electrodes and the ferroelectric layer to prevent unwanted interfacial diffusion and reaction. As mentioned above, adhesion of a conductive electrode to the top surface of the ferroelectric layer is often poor, leading to peeling and poor reliability.

Figure 2:
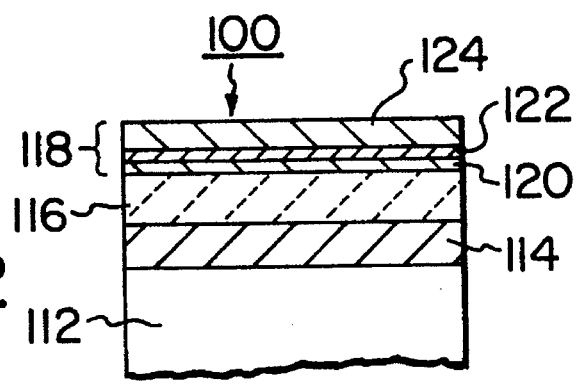
FIGS. 2 and 3 show schematic cross-sectional views through part of an integrated circuit comprising a ferroelectric capacitor structure according to a first embodiment of the present invention, at successive stages during fabrication.
Figure 3:
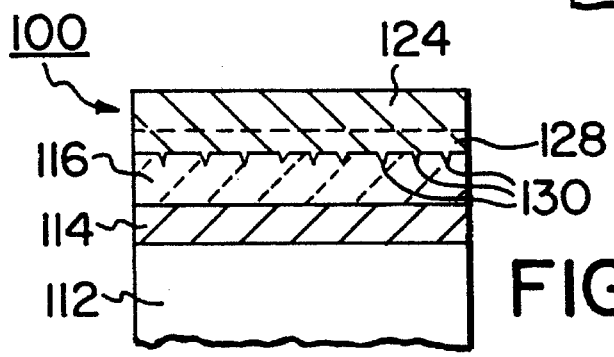
Figure 5:
FIG. 5 shows a photomicrograph showing hillocks of metal alloy which penetrate the interface between an electrode and the ferroelectric dielectric of a capacitor according to the embodiment.

Schematic cross-sectional diagrams of part of an integrated circuit including a capacitor 100 comprising an electrode structure according to an embodiment of the present invention are shown in FIGS. 2 and 3. The capacitor 100 comprises a first (bottom) electrode 114 formed on an integrated circuit substrate 112 in a conventional manner, a layer of ferroelectric dielectric 116 formed thereon, and a multilayer second (top) electrode structure 118. The electrode structure 118 comprises a first thin layer of Pt 120, a second thin layer of Ti 122, and a thicker layer of Pt 124 forming the main thickness of the electrode structure which are annealed to form an interface region 128 which comprises a mixed Pt/Ti alloy layer. As an example, suitable thickness of the first layer of Pt and layer of Ti are ~200Å and the main thickness of Pt is ~1000Å. FIG. 5 shows a photomicrograph of an electrode surface showing alloy hillocks which penetrate the ferroelectric material.

In a method for forming an electrode structure according to a first embodiment of the invention, after depositing the multilayer Pt/Ti/Pt layer, the structure is annealed to cause interdiffusion of the thin layer of Ti 122 into the adjacent layers of Pt 120 and 124. Annealing is carried out at a suitable temperature, compatible with maintaining the integrity of other device structures on the substrate. For example a suitable anneal was done at 400° C. to 450° C. During annealing intermixing of the Pt and Ti layers takes place at the interfaces forming a mixed Pt/Ti layer. This causes alloying of the layers of Ti 122 and Pt 120 in the region 128 near the interface with the ferroelectric layer, since the reaction and mixing does not take place uniformly throughout the thickness, the resulting interface has a rough surface. The resulting interface comprises discrete bumps, that the inventors descriptively called "hillocks", as illustrated schematically in FIG. 3 and as shown in the photomicrograph of FIG. 5. The "hillocks" 130 of the Pt/Ti alloy penetrate into the ferroelectric layer. The term "hillocks" is sometimes used to indicate detrimental formation of crystals at interfaces. In this application the term 'hillocks' refers to the bumps which comprise part of the rough surface of the mixed alloy layer, and which penetrate the dielectric and act as anchors for the electrode material in the ferroelectric. The rough surface and hillocks are beneficial in improving adhesion between the ferroelectric layer and the electrode structure.

Advantageously a triple layer electrode structure formed from layers of Pt/Ti/Pt was wet etchable in aqua regia, which is conventionally used for Pt etching. Unreacted Ti does not etch in aqua regia (i.e. 7:1:8 $HCl:HNO_2:H_2O$), but after annealing at 400° to 450° C. the Pt-Ti alloy formed is etchable in this mixture.

In selecting the thickness of the layers of the multilayer electrode structure, the Pt layer in contact with the PZT should be thin enough to facilitate diffusion of the Ti layer therethrough, but thick enough not to let all the Ti reach the PZT which would lead to formation of an interfacial oxide of $TiO_2$. The latter degrades the electrical characteristics of the interface. In the example described above equal thicknesses of 200Å of each of Pt and Ti were used under 1000Å Pt. In another example which worked well, a first layer of 300Å Pt, then 250Å Ti, and 1000Å Pt was used.

Thus an improved electrode structure compatible with ferroelectric capacitor dielectrics is provided. In particular, a multilayer electrode having improved adhesion to ferroelectric materials such as PZT is formed as a trilayer of a first and second relatively thin layers of first and second conductive layers, e.g. the first two layers are relatively thin ~200Å layers of Pt and Ti, and then a thicker layer of the main, first, electrode material is deposited on top. After annealing, interdiffusion of the layers takes place at the interface. During annealing intermixing of the Pt and Ti layers takes place at the interfaces forming a Pt/Ti alloy. However the reaction and mixing does not take place uniformly throughout the thickness, and formation of hillocks takes place at the interface. These hillocks penetrate into the ferroelectric films and act as anchors providing the required support for the overlying electrode layers. Thus improved adhesion of the overlying conductive films is observed, which improves integrity of this interface during subsequent processing.

Figure 6:
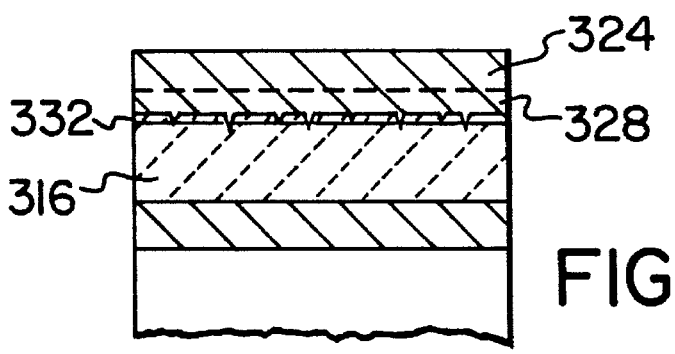
FIG. 6 shows a schematic cross-sectional view through another structure, similar to that of FIG. 3.

In a similar structure, as shown in FIG. 6, the above described multilayer electrode layers 324 and 328, (corresponding to layers 124 and 128 of FIG. 3) also provides good adhesion to a zirconium titanium oxide $ZrTiO_4$ layer 332 which may be used as a barrier layer with PZT dielectric layer 316. (cf. layer 116 of FIG. 3) and other perovskite dielectrics.

Figure 4:
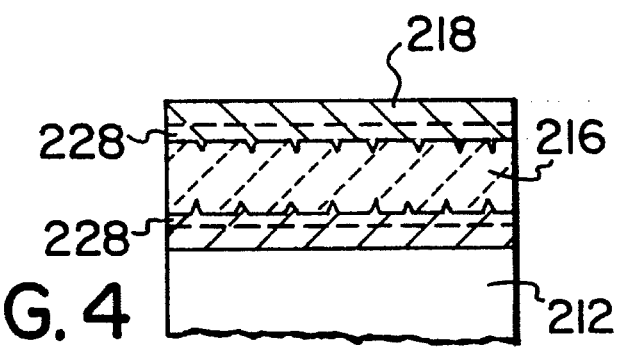
FIG. 4 shows a schematic cross-sectional view through part of an integrated circuit comprising a ferroelectric capacitor structure according to a second embodiment of the present invention.

This multilayer electrode structure may also be used as a bottom electrode on which a layer of PZT or other, the ferroelectric layer being formed on the thin layers of Pt on Ti, overlying the thicker Pt layer. Thus the resulting, substantially symmetric structure as provided by a capacitor structure according to a second embodiment of the invention, is shown schematically in FIG. 4 and comprises first and second electrodes 214 and 218, with the ferroelectric layer 216 disposed between the electrodes, and hillocks 230 extending from the Ti/Pt alloy layer 228 penetrating the interface of the ferroelectric material each electrode.

While the electrode structure was tested with PZT, it is believed that it is compatible with other perovskite ferroelectric materials.

The thin intermediate layer of a metal is selected from metals which interdiffuse with noble metal, and preferably comprises titanium, but it is believed that chromium may also be usefully employed to form an interdiffused multi-layer electrode structure as described above. An oxidation resistant metal is required to form the main portion of the electrode: of the noble metals Pd or Pt are suitable, and do not react with the ferroelectric dielectric material. These metals withstand the processing temperatures required for the formation of the ferroelectric. Since gold diffuses readily into ferroelectric materials it is not preferred for the application described above.

Palladium or platinum are preferred metal over gold for the noble metal layers. Chromium and titanium are preferred metals for the other metal layer, which forms the mixed layer or alloy with the noble metal layers.

What is claimed is:

1. An integrated circuit comprising a ferroelectric capacitor having first and second conductive electrodes and a ferroelectric capacitor dielectric disposed therebetween, at least one electrode of the first and second conductive electrodes comprising a first thin layer of a noble metal adjacent the ferroelectric dielectric, an intermediate thin layer of an other metal, and a second thicker layer of the noble metal, wherein non-uniform interdiffusion of the noble metal of said first thin layer and other metal of said intermediate thin layer at an interface between said at least one electrode and said ferroelectric dielectric form a mixed metal layer having a rough surface penetrating the ferroelectric dielectric, thereby anchoring said at least one electrode in the ferroelectric dielectric.

2. A structure according to claim 1 wherein the rough surface is characterized by hillocks of the mixed metal layer penetrating into the ferroelectric material.

3. A structure according to claim 1 wherein the noble metal is selected from the group consisting palladium and platinum, and the other metal is selected from the group consisting of chromium and titanium.

4. A structure according to claim 1 wherein the noble metal comprises platinum and the other metal comprises titanium.

5. A structure according to claim 4 wherein both the first and second electrodes comprise a Pt/Ti/Pt electrode structure.

6. A structure according to claim 1 wherein the ferroelectric dielectric material comprises one of lead zirconate titanate and doped lead zirconate titanate.

7. A structure according to claim 1 wherein a barrier layer is disposed between the at least one electrode and the ferroelectric dielectric.

8. A structure according to claim 7 wherein the barrier layer comprises zirconium titanium oxide.

\* \* \* \* \*